(12) United States Patent
Bai et al.

(10) Patent No.: US 10,824,201 B2
(45) Date of Patent: Nov. 3, 2020

(54) FLEXIBLE DISPLAY PANEL AND MANUFACTURING METHOD THEREOF

(71) Applicant: Wuhan China Star Optoelectronics Semiconductor Display Technology Co., Ltd., Wuhan (CN)

(72) Inventors: Sihang Bai, Wuhan (CN); Guochao Wang, Wuhan (CN); Junyan Hu, Wuhan (CN)

(73) Assignee: Wuhan China Star Optoelectronics Semiconductor Display Technology Co., Ltd., Wuhan (CM)

( * ) Notice: Subject to any disclaimer, the term of this patent is extended or adjusted under 35 U.S.C. 154(b) by 12 days.

(21) Appl. No.: 16/326,202

(22) PCT Filed: Nov. 16, 2018

(86) PCT No.: PCT/CN2018/115880
§ 371 (c)(1),
(2) Date: Feb. 17, 2019

(87) PCT Pub. No.: WO2020/029461
PCT Pub. Date: Feb. 13, 2020

(65) Prior Publication Data
US 2020/0201391 A1 Jun. 25, 2020

(30) Foreign Application Priority Data
Aug. 6, 2018 (CN) .......................... 2018 1 0883311

(51) Int. Cl.
*G06F 1/16* (2006.01)
*G09F 9/30* (2006.01)
(Continued)

(52) U.S. Cl.
CPC ............ *G06F 1/1652* (2013.01); *G09F 9/301* (2013.01); *H01L 27/3258* (2013.01);
(Continued)

(58) Field of Classification Search
CPC ........................ H01L 27/3258; H01L 51/0097
See application file for complete search history.

(56) References Cited

U.S. PATENT DOCUMENTS

2007/0004308 A1   1/2007  Chang et al.
2015/0021562 A1*  1/2015  Kim .................... H01L 27/3244
                                                                      257/40
(Continued)

FOREIGN PATENT DOCUMENTS

CN    107564941    1/2018
CN    107658333    2/2018
(Continued)

*Primary Examiner* — Jay C Chang
*Assistant Examiner* — Mikka Liu (57) ABSTRACT

A flexible display panel includes a flexible substrate, a blocking layer, a buffering layer, an active layer, a first gate electrode insulating layer, a gate electrode metal layer, a second gate electrode insulating layer, a first source/drain electrode metal layer, an interlayer insulating layer, a first passivation layer, a second source/drain electrode metal layer, a second passivation layer, an anode metal layer, a pixel isolation layer, and a pixel support layer. The second source/drain electrode metal layer is connected to the active layer and the first source/drain electrode metal layer via two through holes.

14 Claims, 4 Drawing Sheets

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ...... *H01L 51/0097* (2013.01); *H01L 51/5253* (2013.01); *H01L 51/56* (2013.01); *H01L 2227/323* (2013.01)

(56) References Cited

U.S. PATENT DOCUMENTS

| | | | |
|---|---|---|---|
| 2016/0293885 A1* | 10/2016 | Park | H01L 51/56 |
| 2019/0131368 A1 | 5/2019 | Zhang et al. | |
| 2019/0148474 A1 | 5/2019 | Bu | |
| 2019/0348485 A1* | 11/2019 | Jo | H01L 24/81 |
| 2019/0386040 A1 | 12/2019 | Wang et al. | |
| 2019/0393289 A1 | 12/2019 | Hu | |

FOREIGN PATENT DOCUMENTS

| | | |
|---|---|---|
| CN | 107706224 | 2/2018 |
| CN | 107910335 | 4/2018 |
| CN | 107994055 | 5/2018 |

* cited by examiner

FIG. 1 providing a substrate and developing a flexible substrate on a surface of the substrate; next sequentially developing a blocking layer and a buffering layer on a surface of the flexible substrate; then developing an active layer on a surface of the buffering layer; after that developing a first gate electrode insulating layer on the surface of the buffering layer, wherein the first gate electrode insulating layer completely covers the active layer; afterwards, developing a gate electrode metal layer on a surface of the first gate electrode insulating layer, forming on the first gate electrode insulating layer a second gate electrode insulating layer which completely covers the gate electrode metal layer, and developing a first source/drain electrode metal layer on the second gate electrode insulating layer — S10 developing an interlayer insulating layer on a surface of the second gate electrode insulating layer, wherein the interlayer insulating layer completely covers the first source/drain electrode metal layer; and etching through a mask the interlayer insulating layer, the second gate electrode insulating layer, the first gate electrode insulating layer, the buffering layer, and the blocking layer to define a first through hole and a channel which is in the non-display area, wherein the active layer is exposed from the first through hole, and the flexible substrate is exposed from the channel — S20 sequentially developing, on a surface of the interlayer insulating layer, a first passivation layer, a second source/drain electrode metal layer, a second passivation layer, an anode metal layer, a pixel isolation layer, and a pixel support layer, wherein the first passivation layer completely covers the channel, and the second source/drain electrode metal layer is connected to the active layer through the first through hole; etching through a mask the first passivation layer to define a second through hole, wherein the second source/drain electrode metal layer is connected to the first source/drain electrode metal layer through the second through hole; finally, removing the substrate — S30

FLEXIBLE DISPLAY PANEL AND MANUFACTURING METHOD THEREOF

RELATED APPLICATIONS

This application is a National Phase of PCT Patent Application No. PCT/CN2018/115880 having International filing date of Nov. 16, 2018, which claims the benefit of priority of Chinese Patent Application No. 201810883311.5 filed on Aug. 6, 2018. The contents of the above applications are all incorporated by reference as if fully set forth herein in their entirety.

FIELD AND BACKGROUND OF THE INVENTION

The present invention relates to the field of display technology, and, in particular, to a flexible display panel and a manufacturing method thereof.

At present, narrow bezel and even bezel-free screens become the mainstream of small-sized mobile phones. In order to increase a screen ratio as much as possible and realize narrow bezel or even no bezel of the mobile phone screen, it is necessary to narrow left and right sides and upper and lower sides of the bezel as much as possible. Bending a flexible back plate backwards is an effective way to reduce the lower side of the bezel. However, reducing an area of the bezel leads to reduction of a width of a voltage signal line of a drain electrode power supply and reduction of a width of a voltage signal line of a source electrode power supply, thus compromising electrical performance and resulting in poor display uniformity. In order to reduce the influence of an increase in voltage drop, a prior art uses a double-layered source/drain electrode metal layer structure. However, the structure is constituted by a first source/drain electrode metal layer and a second source/drain electrode metal layer which are made of the same material. Furthermore, a flexible display panel has an inorganic film layer and passivation layer, so more masks are needed. As a result, costs of the masks increase, and process time and material costs also increase, which is not conducive to mass production.

SUMMARY OF THE INVENTION

The present invention provides a flexible display panel and a manufacturing method thereof. The present invention reduces a layer/film structure and planarizes a source/drain electrode metal layer to thereby solve problems existing in a conventional flexible display panel. The problems of the conventional flexible display panel are as follows. Since a first source/drain electrode metal layer and a second source/drain electrode metal layer are made of the same material, and the flexible display panel has an inorganic film and a passivation layer, so more masks need to be used, which increases production costs and time. This is not conducive to mass production.

The present invention provides a flexible display panel. The flexible display panel includes a flexible substrate, a blocking layer, a buffering layer, an active layer, a first gate electrode insulating layer, a gate electrode metal layer, a second gate electrode insulating layer, a first source/drain electrode metal layer, an interlayer insulating layer, a first passivation layer, a second source/drain electrode metal layer, a second passivation layer, an anode metal layer, a pixel isolation layer, and a pixel support layer. A first through hole and a second through hole are defined in the first passivation layer, the second source/drain electrode metal layer is connected to the active layer through the first through hole, the second source/drain electrode metal layer is connected to the first source/drain electrode metal layer through the second through hole, and a depth of the second through hole is less than a depth of the first through hole.

In the flexible display panel according to the present invention, the first through hole penetrates the first passivation layer, the interlayer insulating layer, the second gate electrode insulating layer, and the first gate electrode insulating layer, and stops at the active layer.

In the flexible display panel according to the present invention, the second through hole penetrates the first passivation layer and the interlayer insulating layer, and stops at the first source/drain electrode metal layer.

In the flexible display panel according to the present invention, the flexible substrate includes a display area and a non-display area outside the display area, a channel is defined in the non-display area, and the first passivation layer completely covers the channel.

In the flexible display panel according to the present invention, the channel penetrates the interlayer insulating layer, the second gate electrode insulating layer, the first gate electrode insulating layer, the buffering layer, and the blocking layer, and stops at the flexible substrate.

In the flexible display panel according to the present invention, the flexible substrate is made of polyimide or polyethylene terephthalate, and the buffering layer is made of one or both of silicon nitride and silicon oxide, the first gate electrode insulating layer is made of silicon nitride or silicon oxide, and the second gate electrode insulating layer is made of a material which is the same as the material for forming the first gate electrode insulating layer.

In the flexible display panel according to the present invention, the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

The present invention further provides a manufacturing method of a flexible display panel, including steps as follows.

S10: providing a substrate and developing a flexible substrate on a surface of the substrate; next sequentially developing a blocking layer and a buffering layer on a surface of the flexible substrate; then developing an active layer on a surface of the buffering layer; after that developing a first gate electrode insulating layer on the surface of the buffering layer, wherein the first gate electrode insulating layer completely covers the active layer; and afterwards, developing a gate electrode metal layer on a surface of the first gate electrode insulating layer, forming on the first gate electrode insulating layer a second gate electrode insulating layer which completely covers the gate electrode metal layer, and developing a first source/drain electrode metal layer on the second gate electrode insulating layer;

S20: developing an interlayer insulating layer on a surface of the second gate electrode insulating layer, wherein the interlayer insulating layer completely covers the first source/drain electrode metal layer; and etching through a mask the interlayer insulating layer, the second gate electrode insulating layer, the first gate electrode insulating layer, the buffering layer, and the blocking layer to define a first through hole and a channel which is in the non-display area, wherein the active layer is exposed from the first through hole, and the flexible substrate is exposed from the channel;

S30: sequentially developing, on a surface of the interlayer insulating layer, a first passivation layer, a second source/drain electrode metal layer, a second passivation layer, an anode metal layer, a pixel isolation layer, and a pixel support layer, wherein the first passivation layer completely covers the channel, and the second source/drain electrode metal layer is connected to the active layer through the first through hole; etching through a mask the first passivation layer to define a second through hole, wherein the second source/drain electrode metal layer is connected to the first source/drain electrode metal layer through the second through hole; and finally, removing the substrate.

In the manufacturing method of the flexible display panel according to the present invention, the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

The present invention provides a flexible display panel. The flexible display panel includes a flexible substrate, a blocking layer, a buffering layer, an active layer, a first gate electrode insulating layer, a gate electrode metal layer, a second gate electrode insulating layer, a first source/drain electrode metal layer, an interlayer insulating layer, a first passivation layer, a second source/drain electrode metal layer, a second passivation layer, an anode metal layer, a pixel isolation layer, and a pixel support layer. A first through hole and a second through hole are defined in the first passivation layer, the second source/drain electrode metal layer is connected to the active layer through the first through hole, and the second source/drain electrode metal layer is connected to the first source/drain electrode metal layer through the second through hole.

In the flexible display panel according to the present invention, the first through hole penetrates the first passivation layer, the interlayer insulating layer, the second gate electrode insulating layer, and the first gate electrode insulating layer, and stops at the active layer.

In the flexible display panel according to the present invention, the second through hole penetrates the first passivation layer and the interlayer insulating layer, and stops at the first source/drain electrode metal layer.

In the flexible display panel according to the present invention, the flexible substrate includes a display area and a non-display area outside the display area, a channel is defined in the non-display area, and the first passivation layer completely covers the channel.

In the flexible display panel according to the present invention, the channel penetrates the interlayer insulating layer, the second gate electrode insulating layer, the first gate electrode insulating layer, the buffering layer, and the blocking layer, and stops at the flexible substrate.

In the flexible display panel according to the present invention, the flexible substrate is made of polyimide or polyethylene terephthalate, the buffering layer is made of one or both of silicon nitride and silicon oxide, the first gate electrode insulating layer is made of silicon nitride or silicon oxide, and the second gate electrode insulating layer is made of a material which is the same as the material for forming the first gate electrode insulating layer.

In the flexible display panel according to the present invention, the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

The advantages of the present invention are as follows. The flexible display panel and the manufacturing method thereof utilize a double-layered source/drain electrode structure, so one gate electrode metal layer is saved. A passivation layer is used to planarize the source/drain electrode metal layer to prevent the interlayer insulating layer from being disconnected, thereby reducing costs of the masks and materials.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DESCRIPTION OF SPECIFIC EMBODIMENTS OF THE INVENTION

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

A conventional flexible display panel has following problems. Since a first source/drain electrode metal layer and a second source/drain electrode metal layer are made of a same material, and the flexible display panel has an inorganic film and a passivation layer, so more masks need to be used, which increases production costs and time. This is not conducive to mass production. The present invention solves the above problems.

Figure 1:
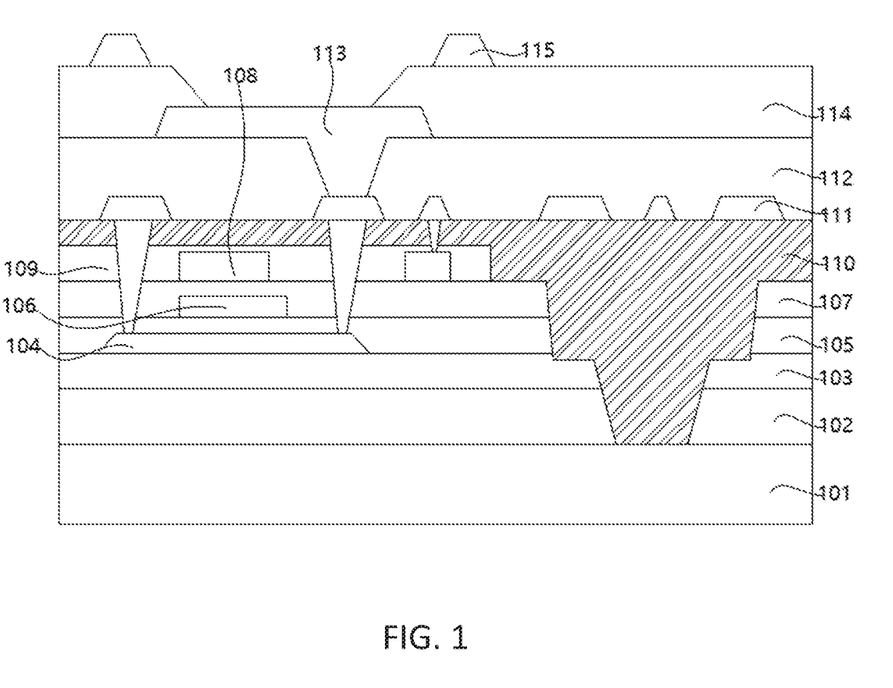
FIG. 1 is a schematic structural view illustrating a flexible display panel according to the present invention.

Please refer to FIG. 1 which shows a flexible display panel according to the present invention. The flexible display panel includes:

a flexible substrate 101;

a blocking layer 102 disposed on a surface of the flexible substrate 101;

a buffering layer 103 disposed on a surface of the blocking layer 102;

an active layer 104 disposed on a surface of the buffering layer 103;

a first gate electrode insulating layer 105 disposed on a surface of the buffering layer 103 and covering the active layer 104;

a gate electrode metal layer 106 disposed on a surface of the first gate electrode insulating layer 105;

a second gate electrode insulating layer 107 disposed on the surface of the first gate electrode insulating layer 105 and covering the gate electrode metal layer 106;

a first source/drain electrode metal layer 108 disposed on a surface of the second gate electrode insulating layer 107, the first source/drain electrode metal layer 108 being disposed corresponding to the gate electrode metal layer 106;

an interlayer insulating layer 109 disposed on a surface of the second gate electrode insulating layer 107 and covering the first source/drain electrode metal layer 108;

a first passivation layer 110 disposed on a surface of the interlayer insulating layer 109;

a second source/drain electrode metal layer 111 disposed on a surface of the first passivation layer 110;

a second passivation layer 112 disposed on the surface of the first passivation layer 110 and covering the second source/drain electrode metal layer 111;

an anode metal layer 113 disposed on a surface of the second passivation layer 112;

a pixel isolation layer 114 disposed on the surface of the second passivation layer 112 and covering two end edges of the anode metal layer 113; and a pixel support layer 115 disposed on s surface of the pixel isolation layer 114;

wherein a first through hole and a second through hole are defined in the first passivation layer 110, the second source/drain electrode metal layer 111 is connected to the active layer 104 through the first through hole, and the second source/drain electrode metal layer 111 is connected to the first source/drain electrode metal layer 108 through the second through hole.

It is preferable that, a depth of the second through hole is less than a depth of the first through hole.

It is preferable that, the first through hole penetrates the first passivation layer 110, the interlayer insulating layer 109, the second gate electrode insulating layer 107, and the first gate electrode insulating layer 105, and stops at the active layer 104.

It is preferable that, the second through hole penetrates the first passivation layer 110 and the interlayer insulating layer 109, and stops at the first source/drain electrode metal layer 108.

It is preferable that, the channel penetrates the interlayer insulating layer 109, the second gate electrode insulating layer 107, the first gate electrode insulating layer 105, the buffering layer 103, and the blocking layer 102, and stops at the flexible substrate 101.

The flexible substrate 101 is made of polyimide or polyethylene terephthalate. The blocking layer 102 is made of one or both of silicon nitride and silicon oxide, and a thickness of the blocking layer 102 is 5000 Å. The buffering layer 103 is made of one or both of silicon nitride and silicon oxide, a thickness of the buffering layer 103 is 3000 Å. The first gate electrode insulating layer 105 is made of silicon nitride or silicon oxide, and a thickness of the first gate electrode insulating layer 105 is 1000 Å. The second gate electrode insulating layer 107 is made of a material which is the same as the material for forming the first gate electrode insulating layer 105. A thickness of the second gate electrode insulating layer 107 is 1200 Å. A thickness of the interlayer insulating layer 109 is 3000 Å. The first source/drain electrode metal layer 108 and the second source/drain electrode metal layer 111 are both made of titanium or titanium aluminum alloy. The gate electrode metal layer 106 is made of molybdenum.

The flexible substrate 101 includes a display area and a non-display area outside the display area, a channel is defined in the non-display area, and the first passivation layer 110 is disposed on a surface of the interlayer insulating layer 109 and completely covers the channel. A function of the first passivation layer 110 is to planarize the interlayer insulating layer 109 and prevent the interlayer insulating layer 109 from being discontinuous, whereby the first through hole and the second through hole can be more smoothly defined in the first passivation layer 110.

The flexible display panel of the present invention includes an organic light emitting layer and a packaging layer, wherein the organic light emitting layer includes a planarization layer, a pixel isolation layer and an organic light-emitting diode (OLED) pixel layer.

Figure 2:
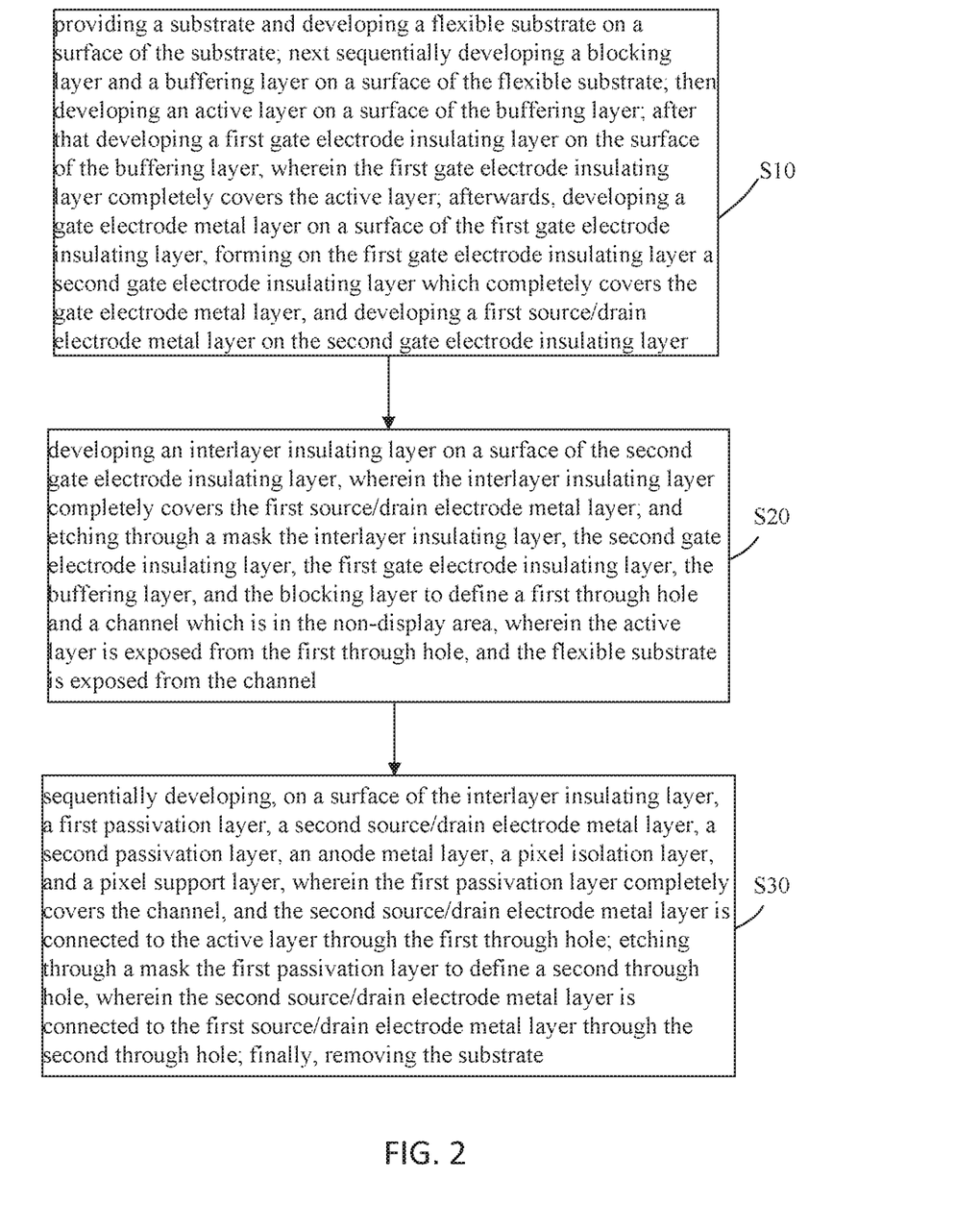
FIG. 2 is a process flow diagram illustrating a manufacturing method of the flexible display panel according to the present invention.

Please refer to FIG. 2, which shows a process flow diagram illustrating a manufacturing method of a flexible display panel. The manufacturing method of the flexible display panel includes steps as follows:

S10: providing a substrate and developing a flexible substrate on a surface of the substrate; next sequentially developing a blocking layer and a buffering layer on a surface of the flexible substrate; then developing an active layer on a surface of the buffering layer; after that developing a first gate electrode insulating layer on the surface of the buffering layer, wherein the first gate electrode insulating layer completely covers the active layer; afterwards, developing a gate electrode metal layer on a surface of the first gate electrode insulating layer, forming on the first gate electrode insulating layer a second gate electrode insulating layer which completely covers the gate electrode metal layer, and developing a first source/drain electrode metal layer on the second gate electrode insulating layer.

Figure 2A:
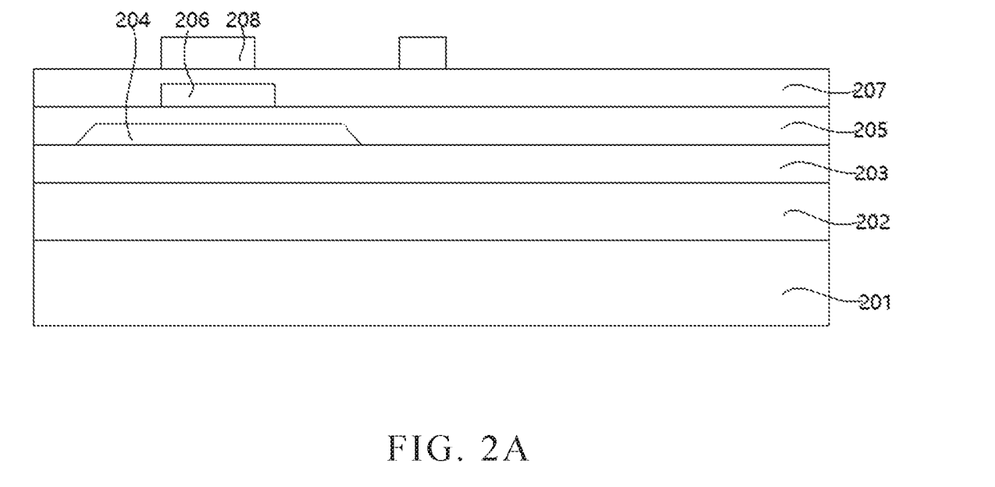
FIGS. 2A, 2B and 2C are schematic views illustrating the process of the manufacturing method of the flexible display panel of FIG. 2.

In detail, Step S10 includes:

First, providing an insulation substrate, depositing a flexible substrate 201 on a surface of the insulation substrate, wherein the flexible substrate 201 is made of polyimide or polyethylene terephthalate; then, sequentially depositing a blocking layer 202 and a buffering layer 203 on a surface of the flexible substrate 201 by physical vapor deposition, wherein the blocking layer 202 is made of one or both of silicon nitride and silicon oxide, a thickness of the blocking layer 202 is 5000 Å, the buffering layer 203 is made of one or both of silicon nitride and silicon oxide, and a thickness of the buffering layer 203 is 3000 Å; after that, forming a semiconductor layer on a surface of the buffering layer 203, and forming the active layer 204 by defining a semiconductor layer structure by a photomask lithography process; thereafter, depositing a first gate electrode insulating layer 205 on the surface of the buffering layer 203, wherein the first gate electrode insulating layer 205 completely covers the active layer 204, the first gate electrode insulating layer 205 is made of nitride silicon or silicon oxide, and a thickness of the first gate electrode insulating layer 205 is 1000 Å; afterward, forming a gate electrode metal layer 206 by performing a photomask lithography process to define a gate electrode conductive structure on a surface of the first gate electrode insulating layer 205, wherein the gate electrode metal layer 206 is made of molybdenum; then, depositing a second gate electrode insulating layer 207 on a surface of the first gate electrode insulating layer 205, wherein the second gate electrode insulating layer 207 is made of a material the same as the material for forming the first gate electrode insulating layer 205, and a thickness of the second gate electrode insulating layer 207 is 1200 Å; finally, forming a first source/drain electrode metal layer 208 by performing a photomask lithography process on a surface of the second gate electrode insulating layer 207 to define a source/drain electrode conductive structure, wherein the first source/drain electrode metal layer 208 is made of titanium or titanium aluminum alloy, a thickness of the first source/drain electrode metal layer 208 is 7600 Å, the first source/drain electrode metal layer 208 replaces a conventional gate electrode metal layer, the first source/drain electrode metal layer 208 and the gate electrode metal layer 206 together form a capacitor for storing electrical charges, which can satisfy a basic 7T1C (seven n-channel TFTs and one storage capacitor) circuit structure, as shown in FIG. 2A.

Figure 2B:
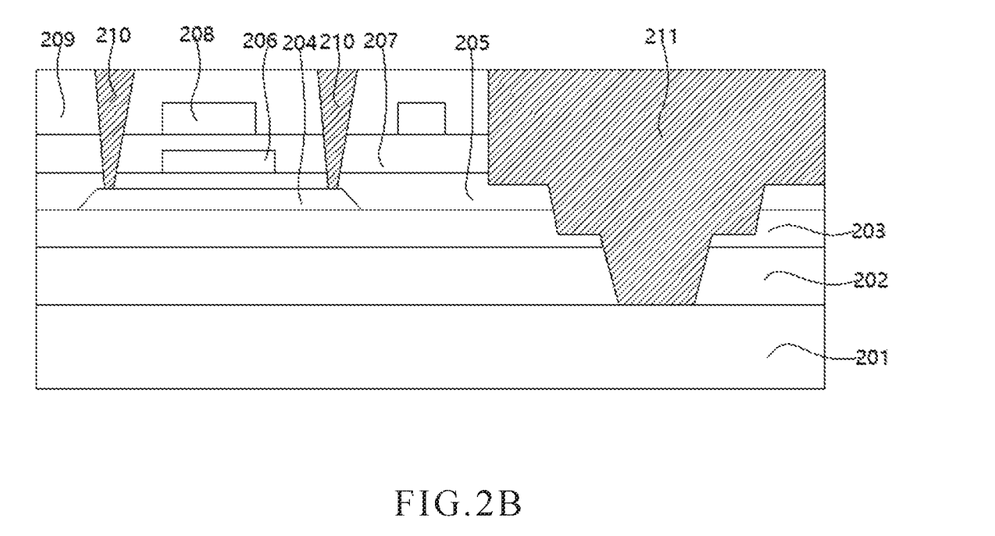

S20: developing an interlayer insulating layer on a surface of the second gate electrode insulating layer, wherein the interlayer insulating layer completely covers the first source/drain electrode metal layer; and etching through a mask the interlayer insulating layer, the second gate electrode insulating layer, the first gate electrode insulating layer, the buffering layer, and the blocking layer to define a first through hole and a channel which is in the non-display area, wherein the active layer is exposed from the first through hole, and the flexible substrate is exposed from the channel;

In detail, Step S20 includes:

First, depositing an interlayer insulating layer 209 on a surface of the second gate electrode insulating layer 207 by physical vapor deposition, wherein the interlayer insulating layer 209 completely covers the first source/drain electrode metal layer 208, the interlayer insulating layer 209 is made of silicon nitride, and a thickness of the interlayer insulating layer 209 is 3000 Å, and the interlayer insulating layer 209 functions to supply hydrogen; and etching through a mask the interlayer insulating layer 209 to define a first through hole 210 and a channel 211, wherein the first through hole 210 penetrates the interlayer insulating layer 209, the second gate electrode insulating layer 207, and the first gate electrode insulating layer 205, and stops at the active layer 204; and the channel penetrates the interlayer insulating layer 209, the second gate electrode insulating layer 207, the first gate electrode insulating layer, the buffering layer 203, and the blocking layer 202, and stops at the flexible substrate 201, as shown in FIG. 2B.

S30: sequentially developing, on a surface of the interlayer insulating layer, a first passivation layer, a second source/drain electrode metal layer, a second passivation layer, an anode metal layer, a pixel isolation layer, and a pixel support layer, wherein the first passivation layer completely covers the channel, and the second source/drain electrode metal layer is connected to the active layer through the first through hole; and etching through a mask the first passivation layer to define a second through hole, wherein the second source/drain electrode metal layer is connected to the first source/drain electrode metal layer through the second through hole; finally, removing the substrate.

Figure 2C:
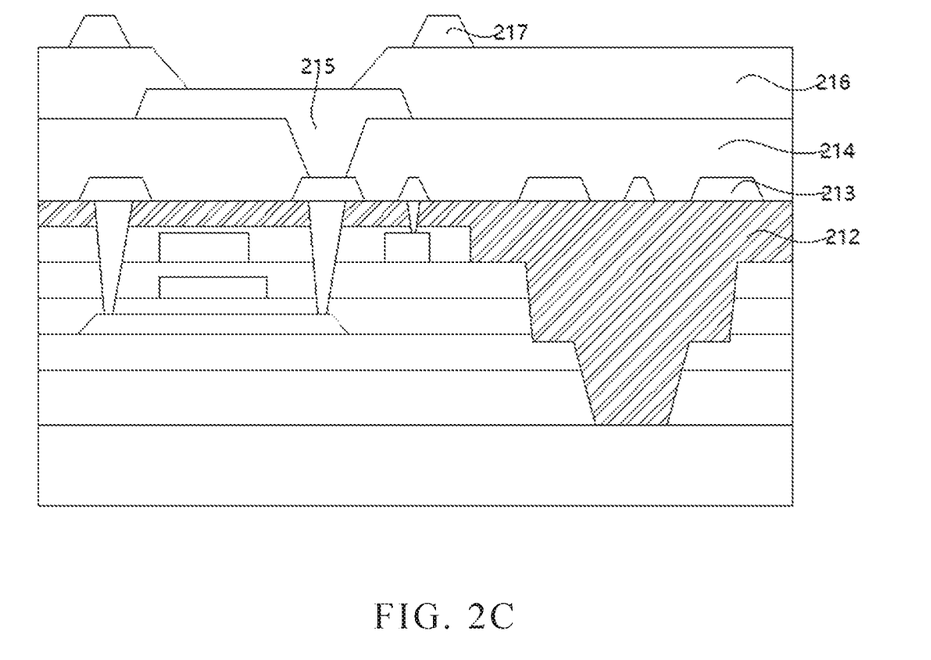

In detail, Step S30 includes:

First, depositing a first passivation layer 212 on a surface of the interlayer insulating layer 209, wherein the first passivation layer 212 is disposed in the display area and fully extended to the non-display area, and the first passivation layer 212 completely fills the channel 211. A smallest thickness of the interlayer insulating layer 209 is 3000 Å, but a thickness of the first source/drain electrode metal layer 208 is about 7600 Å, so the interlayer insulating layer 209 cannot planarize the first source/drain electrode metal layer 208, and therefore, the first passivation layer 212 is used to planarize the first source/drain electrode metal layer 208; then, etching through a mask the first passivation layer 212 to define a second through hole and expose the first through hole; thereafter, forming a second source/drain electrode metal layer 213 by using a photomask lithography process to define a source/drain electrode conductive structure, wherein the second source/drain electrode metal layer 213 is connected to the active layer 204 via the first through hole, and the second source/drain electrode metal layer 213 is connected to the first source/drain electrode metal layer 208 via the second through hole, wherein the second source/drain electrode metal layer 213 and the first source/drain electrode metal layer 208 together constitute a double-layered, mesh-shaped source/drain electrode structure, which effectively reduces a voltage drop of the flexible display panel and improves uniformity of the flexible display panel; finally, sequentially depositing on a surface of the first passivation layer 212, the second source/drain electrode metal layer 213, a second passivation layer 214, an anode metal layer 215, a pixel isolation layer 216, and a pixel support layer 217 and removing the substrate, wherein a portion of the anode metal layer 215 is directly connected to the second source/drain electrode metal layer 213, as shown in FIG. 2C.

The advantages of the present invention are as follows. The flexible display panel and the manufacturing method thereof utilizes a double-layered source/drain electrode structure, so one gate electrode metal layer is saved. The source/drain electrode metal layer is planarized by a passivation layer to further prevent the interlayer insulating layer from being disconnected, thereby reducing costs of the masks and materials.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A flexible display panel, comprising:
  a flexible substrate;
  a blocking layer disposed on a surface of the flexible substrate;
  a buffering layer disposed on a surface of the blocking layer;
  an active layer disposed on a surface of the buffering layer;
  a first gate electrode insulating layer disposed on a surface of the buffering layer and covering the active layer;
  a gate electrode metal layer disposed on a surface of the first gate electrode insulating layer;
  a second gate electrode insulating layer disposed on the surface of the first gate electrode insulating layer and covering the gate electrode metal layer;
  a first source/drain electrode metal layer disposed on a surface of the second gate electrode insulating layer, the first source/drain electrode metal layer being disposed corresponding to the gate electrode metal layer;
  an interlayer insulating layer disposed on a surface of the second gate electrode insulating layer and covering the first source/drain electrode metal layer;
  a first passivation layer disposed on a surface of the interlayer insulating layer;
  a second source/drain electrode metal layer disposed on a surface of the first passivation layer;
  a second passivation layer disposed on the surface of the first passivation layer and covering the second source/drain electrode metal layer;
  an anode metal layer disposed on a surface of the second passivation layer;

a pixel isolation layer disposed on the surface of the second passivation layer and covering two end edges of the anode metal layer; and a pixel support layer disposed on a surface of the pixel isolation layer;

wherein a first through hole and a second through hole are defined in the first passivation layer, the second source/drain electrode metal layer is connected to the active layer through the first through hole, the second source/drain electrode metal layer is connected to the first source/drain electrode metal layer through the second through hole, and a depth of the second through hole is less than a depth of the first through hole, wherein the second through hole penetrates the first passivation layer and the interlayer insulating layer, and stops at the first source/drain electrode metal layer.

2. The flexible display panel according to claim 1, wherein the first through hole penetrates the first passivation layer, the interlayer insulating layer, the second gate electrode insulating layer, and the first gate electrode insulating layer, and stops at the active layer.

3. The flexible display panel according to claim 1, wherein the flexible substrate comprises a display area and a non-display area outside the display area, a trench is defined in the non-display area, and the first passivation layer completely covers the trench.

4. The flexible display panel according to claim 3, wherein the trench penetrates the interlayer insulating layer, the second gate electrode insulating layer, the first gate electrode insulating layer, the buffering layer, and the blocking layer, and stops at the flexible substrate.

5. The flexible display panel according to claim 1, wherein the flexible substrate is made of polyimide or polyethylene terephthalate, and the buffering layer is made of one or both of silicon nitride and silicon oxide, the first gate electrode insulating layer is made of silicon nitride or silicon oxide, and the second gate electrode insulating layer is made of a material which is the same as the material for forming the first gate electrode insulating layer.

6. The flexible display panel according to claim 1, wherein the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

7. A manufacturing method of a flexible display panel, comprising steps as follows:

S10: providing a substrate and developing a flexible substrate on a surface of the substrate; next sequentially developing a blocking layer and a buffering layer on a surface of the flexible substrate; then developing an active layer on a surface of the buffering layer; after that developing a first gate electrode insulating layer on the surface of the buffering layer, wherein the first gate electrode insulating layer completely covers the active layer; afterwards, developing a gate electrode metal layer on a surface of the first gate electrode insulating layer, forming on the first gate electrode insulating layer a second gate electrode insulating layer which completely covers the gate electrode metal layer, and developing a first source/drain electrode metal layer on the second gate electrode insulating layer;

S20: developing an interlayer insulating layer on a surface of the second gate electrode insulating layer, wherein the interlayer insulating layer completely covers the first source/drain electrode metal layer; and etching through a mask the interlayer insulating layer, the second gate electrode insulating layer, and the first gate electrode insulating layer, to define a first through hole and the active layer is exposed from the first through hole, a channel is formed by etching through the mask the interlayer insulating layer, the second gate electrode insulating layer, and the first gate electrode insulating layer in a non-display area, and the flexible substrate is exposed from the channel;

S30: sequentially developing, on a surface of the interlayer insulating layer, a first passivation layer, a second source/drain electrode metal layer, a second passivation layer, an anode metal layer, a pixel isolation layer, and a pixel support layer, wherein the first passivation layer completely covers the channel, and the second source/drain electrode metal layer is connected to the active layer through the first through hole; etching through a mask the first passivation layer to define a second through hole, wherein the second source/drain electrode metal layer is connected to the first source/drain electrode metal layer through the second through hole; finally, removing the substrate.

8. The manufacturing method of the flexible display panel according to claim 7, wherein the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

9. A flexible display panel, comprising:

a flexible substrate;

a blocking layer disposed on a surface of the flexible substrate;

a buffering layer disposed on a surface of the blocking layer;

an active layer disposed on a surface of the buffering layer;

a first gate electrode insulating layer disposed on the surface of the buffering layer and covering the active layer;

a gate electrode metal layer disposed on a surface of the first gate electrode insulating layer;

a second gate electrode insulating layer disposed on the surface of the first gate electrode insulating layer and covering the gate electrode metal layer;

a first source/drain electrode metal layer disposed on a surface of the second gate electrode insulating layer, the first source/drain electrode metal layer being disposed corresponding to the gate electrode metal layer;

an interlayer insulating layer, the interlayer insulating layer being disposed on the surface of the second gate electrode insulating layer and covering the first source/drain electrode metal layer;

a first passivation layer disposed on a surface of the interlayer insulating layer;

a second source/drain electrode metal layer disposed on a surface of the first passivation layer;

a second passivation layer disposed on a surface of the first passivation layer and covering the second source/drain electrode metal layer;

an anode metal layer disposed on a surface of the second passivation layer;

a pixel isolation layer disposed on the surface of the second passivation layer and covering two end edges of the anode metal layer; and a pixel support layer disposed on a surface of the pixel isolation layer;

wherein a first through hole and a second through hole are defined in the first passivation layer, the second source/drain electrode metal layer is connected to the active layer through the first through hole, and the second source/drain electrode metal layer is connected to the first source/drain electrode metal layer through the second through hole, wherein the second through hole penetrates the first passivation layer and the interlayer insulating layer, and stops at the first source/drain electrode metal layer.

10. The flexible display panel according to claim 9, wherein the first through hole penetrates the first passivation layer, the interlayer insulating layer, the second gate electrode insulating layer, and the first gate electrode insulating layer, and stops at the active layer.

11. The flexible display panel according to claim 9, wherein the flexible substrate comprises a display area and a non-display area outside the display area, a trench is defined in the non-display area, and the first passivation layer completely covers the trench.

12. The flexible display panel according to claim 11, wherein the trench penetrates the interlayer insulating layer, the second gate electrode insulating layer, the first gate electrode insulating layer, the buffering layer, and the blocking layer, and stops at the flexible substrate.

13. The flexible display panel according to claim 9, wherein the flexible substrate is made of polyimide or polyethylene terephthalate, and the buffering layer is made of one or both of silicon nitride and silicon oxide, the first gate electrode insulating layer is made of silicon nitride or silicon oxide, and the second gate electrode insulating layer is made of a material which is the same as the material for forming the first gate electrode insulating layer.

14. The flexible display panel according to claim 9, wherein the gate electrode metal layer is made of molybdenum, the first source/drain electrode metal layer is made of titanium or titanium aluminum alloy, and the second source/drain electrode metal layer is made of a material which is the same as the material for forming the first source/drain electrode metal layer.

* * * * *